US011851572B2

(12) United States Patent
Swisher et al.

(10) Patent No.: US 11,851,572 B2
(45) Date of Patent: Dec. 26, 2023

(54) THERMAL CURE DIELECTRIC INK

(71) Applicant: Liquid X Printed Metals, Inc., Pittsburgh, PA (US)

(72) Inventors: Robert G Swisher, Pittsburgh, PA (US); Christianna M Petrak, Brackenridge, PA (US)

(73) Assignee: LIQUID X PRINTED METALS, INC., Pittsburgh, PA (US)

( * ) Notice: Subject to any disclaimer, the term of this patent is extended or adjusted under 35 U.S.C. 154(b) by 580 days.

(21) Appl. No.: 16/807,286

(22) Filed: Mar. 3, 2020

(65) Prior Publication Data

US 2020/0283653 A1 Sep. 10, 2020

Related U.S. Application Data

(60) Provisional application No. 62/927,991, filed on Oct. 30, 2019, provisional application No. 62/814,996, filed on Mar. 7, 2019.

(51) Int. Cl.
| | | |
|---|---|---|
| C09D 11/52 | (2014.01) | |
| C09D 11/36 | (2014.01) | |
| C09D 11/14 | (2006.01) | |
| C09D 11/106 | (2014.01) | |
| B41M 5/00 | (2006.01) | |
| B41M 5/50 | (2006.01) | |
| H05K 1/03 | (2006.01) | |
| C08K 3/36 | (2006.01) | |
| C08K 3/34 | (2006.01) | |
| C08K 3/22 | (2006.01) | |

(52) U.S. Cl.
CPC ........... *C09D 11/52* (2013.01); *B41M 5/0023* (2013.01); *B41M 5/502* (2013.01); *C09D 11/106* (2013.01); *C09D 11/14* (2013.01); *C09D 11/36* (2013.01); *H05K 1/038* (2013.01); *C08K 3/346* (2013.01); *C08K 3/36* (2013.01); *C08K 2003/2227* (2013.01); *C08K 2003/2272* (2013.01); *C08K 2201/005* (2013.01); *C08K 2201/011* (2013.01); *H05K 2201/0209* (2013.01)

(58) Field of Classification Search
CPC ......... C09D 11/52; C09D 11/36; C09D 11/14; C09D 11/106
USPC ....................................................... 428/172
See application file for complete search history.

(56) References Cited

U.S. PATENT DOCUMENTS

| | | | |
|---|---|---|---|
| 3,660,328 A | 5/1972 | Linquist, Jr. et al. | |
| 4,016,129 A | 4/1977 | Miyosawa | |
| 4,588,649 A | 5/1986 | Kriz et al. | |
| 4,810,463 A * | 3/1989 | Schwarz | ........... C04B 35/63416 |
| | | | 264/657 |
| 5,262,474 A | 11/1993 | Minnis et al. | |
| 6,096,469 A | 8/2000 | Anderson et al. | |
| 6,363,606 B1 | 4/2002 | Johnson, Jr. et al. | |
| 7,754,003 B2 | 7/2010 | Aoki et al. | |
| 8,659,158 B2 | 2/2014 | Cai et al. | |
| 9,745,481 B2 | 8/2017 | Rolin et al. | |
| 2002/0061394 A1* | 5/2002 | Fujita | ....................... G03C 1/93 |
| | | | 428/483 |
| 2007/0111014 A1 | 5/2007 | Katsoulis et al. | |
| 2009/0263647 A1 | 10/2009 | Gangopadhyay et al. | |
| 2011/0274914 A1 | 11/2011 | Nakao et al. | |
| 2014/0009545 A1 | 1/2014 | Carmody | |
| 2014/0151607 A1 | 6/2014 | Lowenthal et al. | |
| 2014/0374670 A1* | 12/2014 | Mokhtari | ............... C09D 11/52 |
| | | | 252/514 |
| 2015/0355540 A1 | 12/2015 | Cho et al. | |
| 2018/0112089 A1 | 4/2018 | Pickrell et al. | |
| 2018/0201800 A1* | 7/2018 | Wang | ..................... C09D 11/52 |
| 2019/0055412 A1* | 2/2019 | Monickam | ............... C08K 9/06 |

FOREIGN PATENT DOCUMENTS

| | | |
|---|---|---|
| JP | 2007087636 A * | 4/2007 |
| WO | 2018/213161 A1 | 11/2018 |

OTHER PUBLICATIONS

Machine_English_translation_JP_2007087636_A; Coating Composition for Forming Dielectric Layer; May 4, 2007; EPO; whole document (Year: 2023).*
Sekisui, Selvol Polyvinyl Alcohol for Ink Jet Printing Papers, p. 1-6.
Mandal, S. et al., A hybrid dielectric ink consisting of up to 50 wt% of TiO2 nanoparticles in polyvinyl alcohol (PVA), Journal of Chemistry and Chemical Engineering, vol. 6, Jan. 2012, p. 625-630.
Dielectric Inks & Coatings, www.creativematerials.com/products/dielectric-inks, Mar. 20, 2019.
Dorin, B. et al., Characterization of a silica-PVA hybrid for high density and stable silver dissolution, Materials Chemistry and Physics, Mar. 4, 2016.
Choudhary, S., Characterization of amorphous silica nanofiller effect on the structural morphological, optical, thermal, dielectric and electrical properties of PVA-PVP blend based polymer nanocomposites for their flexible nanodielectric applications, Journal of Materials Science: Materials in Electronics, vol. 29, Issue No. 12, Jun. 2018, p. 10517-10534.
Basics of Schottky Barrier Diodes, Chapter 1 Basics of Schottky Barrier Diodes (Basic of Semiconductor Device), https://toshiba.semicon-storage.com/eu/semiconductor/knowledge/e-learning/basics-of-schottky-barrier-diodes/chap1/chap1-1.html.

* cited by examiner

*Primary Examiner* — Tahseen Khan
(74) *Attorney, Agent, or Firm* — Dentons Cohen & Grigsby P.C.

(57) ABSTRACT

Dielectric coating compositions are provided. The dielectric coating compositions generally include an aqueous binder, an inorganic nanoparticle, and a solvent, and can be formulated for specific printing methods, such as inkjet printing. The dielectric coating compositions are curable to provide scratch resistant coatings useful as insulating layers.

19 Claims, No Drawings

THERMAL CURE DIELECTRIC INK

CROSS REFERENCE TO RELATED APPLICATIONS

The present application claims the benefit of priority of prior U.S. Provisional Patent Application Ser. No. 62/814,996, filed Mar. 7, 2019 and U.S. Provisional Patent Application Ser. No. 62/927,991, filed Oct. 30, 2019.

FIELD OF THE INVENTION

The present invention relates to compositions useful as dielectric coatings, and more specifically to ink compositions comprising a water-soluble binder and an inorganic nanoparticle that may be printed on a substrate and heat-cured to form water-resistant, scratch-resistant dielectric coatings.

BACKGROUND OF THE INVENTION

Dielectric or insulating layers are used in electronic devices to prevent electrical leakage (i.e. short circuits) between distinct conducting portions. Dielectric layers have the capacity to polarize in the direction of the electric field and may help to reduce the effect of any electromagnetic coupling between discrete conducting tracks.

The miniaturization and multi-layering in modern electronic devices, such as transistors, diodes, capacitors, resistors, photovoltaic cells, batteries, and organic light emitting diodes (OLEDs) has led to a need for the dielectric layers to be patterned into ever more complicated and fine shapes. Additionally, the concern for environmental issues worldwide has been a driving force to formulate such dielectric layers in water systems to replace the volatile organic compounds found in the solvents that are standard in the formulation of dielectric layers or coatings.

Accordingly, coatings or inks that may be printed or deposited in fine patterns, reduce the use of volatile organic compounds, and provide electrical insulation are needed.

SUMMARY OF THE INVENTION

Disclosed herein are aqueous heat-curable inks and coating compositions that can be printed onto a wide range of substrates to produce dielectric layers and traces in the complicated patterns and fine shapes required in modern electronics.

The present invention relates to dielectric coating compositions or inks comprising an aqueous binder, an inorganic nanoparticle, and one or more polar protic solvents. The aqueous binder may comprise a polyvinyl alcohol, a hydroxy cellulose, a hydrogel, or a combination thereof. The inorganic nanoparticle may comprise $SiO_2$ nanoparticles, $Al_2O_3$ nanoparticles, $TiO_2$ nanoparticles, $ZrO_2$ nanoparticles, iron oxide nanoparticles, ferrite nanoparticles, nanoclay, or a combination thereof. According to certain aspects, the inorganic nanoparticle may be a colloidal particle. According to certain aspects, the inorganic nanoparticle may have a particle size of less than 100 nm, or even less than 50 nm.

The presently disclosed dielectric coating compositions may have a viscosity measured at 25° C. of 1 to 20,000 centipoise. According to certain aspects, the dielectric coating compositions may have a viscosity suitable for ink jet printing, such as from 2 to 40 centipoise measured at 25° C. According to certain aspects, the dielectric coating compositions may have a viscosity suitable for gravure printing, such as from 50 to 300 centipoise measured at 25° C. According to certain aspects, the dielectric coating compositions may have a viscosity suitable for flexographic printing, such as from 100 to 500 centipoise measured at 25° C.

The present invention also relates to dielectric coating compositions formulated for printing on a substrate, wherein the composition comprises 2-15 wt. % of an aqueous binder, 1-5 wt. % of a colloidal silica having a particle size of less than 100 nm, and an aqueous solvent, wherein the composition has a viscosity measured at 25° C. of 2 to 400 centipoise. According to certain aspects, the aqueous binder comprises a polyvinyl alcohol, a hydroxy cellulose, a hydrogel, or a combination thereof. According to certain aspects, the composition may be printed by inkjet, gravure, flexographic, or screen-printing techniques, wherein the viscosity of the ink is adjusted for the specific technique, e.g., for inkjet printing the viscosity measured at 25° C. may be 2 to 40 centipoise and for flexographic printing the viscosity may be 100 to 400 centipoise.

The coating composition may be provided in a format configured for a specific printing technique, i.e., a composition having a specific viscosity, or may be provided as a concentrate in combination with a suitable solvent so that the viscosity may be adjusted by the end user for a specific printing technique (i.e., as a two component system).

The present invention also relates to methods of printing an insulating layer comprising providing a dielectric coating composition for forming an insulating layer and printing the composition onto a substrate, wherein the dielectric coating composition comprises an aqueous binder, an inorganic nanoparticle having a particle size of less than 250 nm, and one or more polar protic solvents. According to certain aspects, the method may further comprise curing the composition using thermal energy. Curing may comprise heating the substrate to a temperature of 250° C. or less for 30 minutes or less, or photonic curing. According to certain aspects, the dielectric coating composition may be dried before curing.

DETAILED DESCRIPTION OF THE INVENTION

As generally used herein, the articles "one", "a", "an" and "the" refer to "at least one" or "one or more", unless otherwise indicated. For example, although reference is made herein to "a" binder, "an" inorganic nanoparticle, and "the" solvent, one or more of any of these components and/or any other components described herein can be used.

The word "comprising" and forms of the word "comprising", as used in this description and in the claims, does not limit the present invention to exclude any variants or additions. Additionally, although the present invention has been described in terms of "comprising", the dielectric coating compositions detailed herein may also be described as consisting essentially of or consisting of. For example, while the invention has been described in terms of a dielectric coating composition comprising an aqueous binder, an inorganic nanoparticle, and one or more polar protic solvents, a dielectric coating composition consisting essentially of or consisting of an aqueous binder, an inorganic nanoparticle, and one or more polar protic solvents is also within the present scope. In this context, "consisting essentially of" means that any additional components will not materially affect the insulating ability of the dielectric coating composition or dielectric coating deposited therefrom.

The use of "or" means "and/or" unless specifically stated otherwise.

Other than in any operating examples, or where otherwise indicated, all numbers expressing, for example, quantities of ingredients used in the specification and claims are to be understood as being modified in all instances by the term "about". Accordingly, unless indicated to the contrary, the numerical parameters set forth in the following specification and appended claims are approximations that may vary depending upon the substrate used and the desired properties to be obtained by the present invention. At the very least, and not as an attempt to limit the application of the doctrine of equivalents to the scope of the claims, each numerical parameter should at least be construed by considering the number of reported significant digits and by applying ordinary rounding techniques.

Notwithstanding that the numerical ranges and parameters setting forth the broad scope of the invention are approximations, the numerical values set forth in the specific examples are reported as precisely as possible. Any numerical value, however, inherently contains certain errors necessarily resulting from the standard variation found in their respective testing measurements.

As used herein, the term "polymer" refers to prepolymers, oligomers and both homopolymers and copolymers, and the prefix "poly" refers to two or more. As used herein, the term "monomer" refers to a simple molecule of relatively low molecular weight, which can react chemically with other molecules to form a dimer, trimer, or polymer (i.e., joined in a repeating fashion).

"Particle size", as used herein, indicates the average particle size of a range of particle sizes, which may be represented by a size distribution curve. The numerical values for the size distribution curve may be obtained by dynamic light scattering (DLS) methods. Particle sizes and ranges disclosed herein are the peak mean values, based on intensity, of these distribution curves as measured by DLS methods assuming spherical shape of particles that are dispersed in water.

"Including" and like terms means including, but not limited to. When ranges are given, any endpoints of those ranges and/or numbers within those ranges can be combined within the scope of the present invention.

As used herein, "deposition" includes any and all printing, coating, rolling, spraying, layering, sputtering, plating, spin casting (or spin coating), vapor deposition, lamination, affixing and/or other deposition processes, whether impact or non-impact, known in the art.

As used herein, "printing" includes any and all printing, coating, rolling, spraying, layering, spin coating, lamination and/or affixing processes, whether impact or non-impact, known in the art, and specifically includes, for example and without limitation, screen printing, inkjet printing, electro-optical printing, electroink printing, photoresist and other resist printing, thermal printing, laser jet printing, magnetic printing, pad printing, flexographic printing, hybrid offset lithography, Gravure and other intaglio printing, and aerosol jet orienting, for example. All such processes are considered deposition processes herein and may be utilized.

As used herein, the term "ambient conditions" may include temperatures across a broad range such as, for example 0° C. to <50° C. The dielectric coating compositions of the present invention may cure upon exposure to radiant energy, such as thermal energy. As used herein, the term "thermal energy" is intended to include radiant energy such as ultraviolet, infrared, or microwave energy and the like; or conductive thermal energy such as that produced by a heated platen, hot air oven, or heated substrate material, or photonic curing, for example.

As used herein, the term "cure" or "curable" refers to the capability of a compound to undergo one or more chemical reactions to form stable, covalent bonds among the constituent components.

In the following description, certain details are set forth in order to provide a better understanding of various embodiments of a dielectric coating composition. However, one skilled in the art will understand that these embodiments may be practiced without these details and/or in the absence of any details not described herein. In other instances, well-known structures, methods, and/or techniques associated with methods of practicing the various embodiments may not be shown or described in detail to avoid unnecessarily obscuring descriptions of other details of the various embodiments.

The present invention is related to novel dielectric coating compositions that, when applied to a substrate, may be heat-cured to form a hardened, scratch resistant insulating or dielectric layer or film. The dielectric coating compositions may be deposited on a wide range of substrates using any deposition or printing method known in the art. According to certain preferred aspects of the present invention, the dielectric coating compositions may be inkjet printed or deposited using gravure or flexographic printing methods.

As used herein, the terms "heat-cured" or "thermal cured" may be used interchangeably, and when used in reference to a coating composition as disclosed herein may be taken to mean a composition that will cure upon exposure to thermal energy such as radiant energy (e.g., infrared, or microwave energy and the like) or conductive thermal energy (e.g., such as that produced by a heated platen, hot air oven, or heated substrate material). As disclosed, a heat-cured composition may be stable for a period of time at ambient conditions, such as when protected from evaporation (i.e., when contained within a closed container). As used herein, "ambient conditions" may include temperatures across a broad range such as, for example, reduced temperatures (i.e., >0° C. to <25° C.) or slightly elevated temperatures (i.e., >25° C. to <50° C.).

The dielectric coating compositions may be cured using thermal energy, such as by heating to temperatures above ambient conditions. For example, the dielectric coating compositions may be cured by heating to a temperature of at least 50° C., such as at least 80° C., or at least 100° C., or at least 110° C., or at least 120° C., or at least 130° C. The dielectric coating compositions may be cured by heating to a temperature of less than 250° C., such as less than 240° C., or less than 230° C., or less than 220° C., or less than 210° C., or less than 200° C. The dielectric coating compositions may be cured by heating to a temperature of about 100° C. to about 200° C., such as about 120° C. to about 180° C., or about 120° C. to about 160° C., or about 130° C. to about 150° C.

The duration of the thermal cure may depend on the temperature of the curing step, but generally requires a time of less than about 60 minutes. For example, the dielectric coating compositions may be cured at 130° C. to about 150° C. for less than 30 minutes, such as from about 5 minutes and about 20 minutes, or 10 minutes to 30 minutes. The dielectric coating compositions may be cured at temperatures of less than 250° C. for less than 10 minutes, such as less than 5 minutes or even for a time of about 1 minute or less.

Alternatively, or in addition, curing may include irradiating the substrate, such as by exposure to 1 to 20 pulses of light, e.g., photonic curing, or may include exposure to infrared radiation.

According to certain aspects of the present invention, the dielectric coating composition may be deposited on a substrate and cured during or directly after the deposition (e.g., inkjet printing) process ("in situ curing") by any of the curing methods detailed herein (i.e., thermal cure, IR cure, photonic cure, etc.).

According to certain aspects of the present invention, the dielectric coating composition may be dried before the thermal cure step. For example, the solvent(s) may be evaporated from the dielectric coating composition, such as under ambient conditions (i.e., >0° C. to <25° C. or even >25° C. to <50° C.), by exposure to reduced humidity (e.g., relative humidity of less than 40% or even 30%), exposure to increased air circulation, and/or exposure to temperatures that are less than 120° C. (i.e., such as >25° C. to <120° C.). Thus, according to certain aspects, a low temperature solvent removal step may be included before the dielectric coating compositions are thermally cured. For example, according to certain aspects, the solvent may be removed from the printed dielectric coating composition by heating to a temperature of about 80° C. to about 120° C., after which the dielectric coating may be cured at a temperature of about 120° C. to about 180° C., or about 120° C. to about 160° C., or about 130° C. to about 150° C.

According to certain aspects of the present invention, the coating may be cured by air drying under ambient conditions for extended periods of time. For example, the coating may be cured by exposure to temperatures in the range of >25° C. to <50° C.

The dielectric coating compositions may be printed over a conductive trace or layer, such as over a conductive trace formed using any of the ink compositions and methods described in Patent Publication Nos. US2013/0111138, US2013/0236656, or U.S. Pat. No. 9,487,669.

According to certain aspects of the present invention, the cured dielectric coating may have a thickness of less than about 250 nm to at least about 5 microns, such as less than about 200 nm to at least about 5 microns, or about 100 nm to about 5 microns. For example, the cured dielectric coating may have a thickness of less than 100 microns, or less than 90 microns, or less than 80 microns, or less than 70 microns, or less than 60 microns, or less than 50 microns, or lea than 40 microns, or less than 30 microns. The cured dielectric coating composition may have a thickness or at least 5 microns, or at least 10 microns, or at least 20 microns, or at least 30 microns, or at least 40 microns, or at least 50 microns. The coating thickness may be within any of the upper and lower limits disclosed herein, such as between about 20 microns at about 100 microns. The thickness of the cured dielectric coating may depend on the printing or deposition method and the viscosity of the uncured dielectric coating composition or ink.

The dielectric coating compositions generally comprise an aqueous binder, an inorganic nanoparticle, and one or more polar protic solvents. Aqueous binders generally include organic binders comprising free hydroxyl groups. Exemplary organic binders include at least polyvinyl alcohols, celluloses, and hydrogels.

According to certain aspects of the present invention, the aqueous binder may be a polyvinyl alcohol. Exemplary polyvinyl alcohols include those having molecular weights of from 5,000 to 100,000, such as from 5,000 to 55,000, or 8,000 to 55,000, or from 5,000 to 13,000, or from 8,000 to 11,000, or from 8,000 to 13,000, or from 13,000 to 28,000, or from 12,000 to 25,000, or from 26,000 to 100,000, or from 30,000 to 55,000, or from 31,000 to 50,000 (all molecular weights listed are weight average molecular weights $M_w$).

According to certain aspects of the present invention, the aqueous binder may be a substituted polyvinyl such as poly(4-vinylphenol) (PVP). According to certain aspects of the present invention, the aqueous binder may be a cellulose such as hydroxyalkyl celluloses (e.g., hydroxypropylmethyl cellulose, hydroxypropyl cellulose, hydroxyethyl cellulose, hydroxymethyl cellulose). According to certain aspects of the present invention, the aqueous binder may be a hydrogel such as poly hydroxyethyl acrylate and poly hydroxypropyl acrylate.

According to certain aspects of the present invention, the aqueous binder may be included in the coating composition at from 1-20 wt. %, based on the total weight of the composition, such as from 2-20 wt. %, or 2-15 wt. %, or from 2-10 wt. %, or from 2-8 wt. %.

The inorganic nanoparticle may comprise one or more of $SiO_2$, $Al_2O_3$, $TiO_2$, $ZrO_2$, $Fe_2O_3$, ferrite material, nanoclay, or a combination thereof. The inorganic nanoparticle may be supplied as a colloidal dispersion in an aqueous solvent, or in a volatile organic solvent.

According to certain aspects of the present invention, the inorganic nanoparticle may be included in the coating composition at 0.1-10 wt. %, based on the total weight of the composition, such as 0.5-8 wt. %, or 0.5-5 wt. %, or 1-5 wt. %.

According to certain aspects of the present invention, the cured dielectric coating may contain from 10 wt. % to 70 wt. %, such as about 20 wt. % to about 60 wt. %, of the inorganic nanoparticle with respect to the total solids content of the cured coating. According to certain aspects of the present invention, the cured dielectric coating may contain from 30 wt. % to 90 wt. %, such as about 40 wt. % to about 80 wt. %, of the aqueous binder with respect to the total solids content of the cured coating.

According to certain aspects, the inorganic nanoparticles may be the mineral or metal oxides $SiO_2$, $Al_2O_3$, $TiO_2$, $ZrO_2$, $Fe_2O_3$, ferrite material having an average particle diameter of about 2 nm to about 250 nm, such as about 3 nm to about 200 nm, about 5 nm to about 150 nm, or about 5 nm to about 100 nm, or about 5 nm to about 50 nm. According to certain aspects, the inorganic nanoparticles comprise silica preferably having an average particle diameter of less than 100 nm, such as between 2 nm and <100 nm, or between 2 nm and 50 nm, supplied as a 10 to 30 wt. % colloidal dispersion in an aqueous solvent.

The inorganic nanoparticles preferably have a narrow particle size distribution, i.e. a low relative standard deviation of the particle size. The inorganic nanoparticles may be dispersed in a substantially aqueous solvent to form a sol having a nanoparticle content of from about 10% to about 50% by volume. The inorganic nanoparticle may be supplied with a surface modification for improved dispersion stability and/or coating compatibility.

According to certain aspects of the present invention, the inorganic nanoparticle may be a silica nanoparticle, such as precipitated silica or silica gel powder (PQ Corporation). The silica may be colloidal in nature and commercially available as colloidal silica. The small particle size of colloidal silica may lead to a smooth transparent coating upon curing. Additionally, the larger overall surface area presented by the smaller particles may lead to increased reaction with the aqueous binder, and tighter crosslinking.

Accordingly, the particle size may be selected based on at least the desired level of crosslinking and the intended method of deposition (e.g., inkjet printing may benefit from smaller particle sizes, such as particles of less than 100 nm or even less than 50 nm, such as from about 5 nm to about 50 nm).

An exemplary preferred colloidal silica is sold under the brand name of Snowtex® (ST-O), which has an average particle diameter of 10-20 nm and an $SiO_2$ content of about 20 wt. %.

According to certain aspects of the present invention, the inorganic nanoparticle may be an alumina nanoparticle, such as a highly dispersible boehmite (Sasol Chemicals) having small particle sizes. An exemplary preferred alumina is sold under the brand name Disperal® and Disperal® P2 (Sasol Chemicals North America LLC), having particle sizes of 20 and 40 nm, respectively.

According to certain aspects of the invention, the inorganic nanoparticle may comprise nanoclay. Nanoclays (nanosized clays) are plate-like materials, the clay mineral being generally selected from smectite, vermiculite and halloysite clays. The smectite clay in turn can be selected from montmorillonite, saponite, beidellite, nontrite, hectorite and mixtures thereof. A preferred clay mineral is the montmorillonite clay, a layered alumino-silicate. The nanoclay platelets generally have a thickness of about 3-1000 Angstroms and a size in the planar direction ranging from about 0.01 micron to 100 microns. The aspect ratio (length versus thickness) is generally in the order of 10 to 10,000. These clay platelets are separated by a gallery, a space between parallel layers of clay platelets containing various ions holding platelets together. An exemplary nanoclay is Cloisite® 10A (available from Southern Clay Products), its platelets having a thickness of about 0.001 micron (10 Angstroms) and a size in the planar direction of about 0.15 to 0.20 micron.

According to certain aspects, the inorganic nanoparticles comprise iron oxide nanoparticles having a particle size of less than 250 nm, such as less than 200 nm.

According to certain aspects, combinations of one or more different nanoparticles, e.g., silica and iron oxide, may be included in the dielectric coating compositions, Without wishing to be bound by any theory, the aqueous components of the composition are thermally cured to form a hardened, water-resistant, scratch-resistant coating. The free hydroxyl groups of the binder may react at elevated temperatures with the groups on the inorganic nanoparticle, such as the silanol groups on the silica, through a condensation reaction to harden the composition.

The solvent may include one or more polar protic solvents. According to certain aspects of the invention, the one or more polar protic solvents may comprise an aqueous solvent comprising at least water and optionally may additionally comprise a water miscible organic co-solvent such as a glycol (e.g., mono-, di- or tri-ethylene glycols or higher ethylene glycols, propylene glycol, 1,4-butanediol or ethers of such glycols, thiodiglycol), glycerol and ethers and esters thereof, polyglycerol, mono-, di-, and tri-ethanolamine, propanolamine, N,N-dimethylformamide, dimethylsulfoxide, N,N-dimethylacetamide, N-methylpyrrolidone, 1,3-dimethylimidazolidone, methanol, ethanol, isopropanol, n-propanol, diacetone alcohol, 2-butoxyethanol, acetone, methyl ethyl ketone, propylene carbonate, and combinations thereof may be used.

The one or more polar protic solvents may be included in the dielectric coating compositions at from 20 wt. % to 98.9 wt. %, such as from 30 wt. % to 98 wt. %, or from 40 wt. % to 95 wt. %, or from 60 wt. % to 95 wt. %. According to certain aspects, the solvent may be included in the dielectric coating composition so that the total solids content of the composition before cure is from 2 wt. % to 50 wt. %, such as from 2 wt. % to 40 wt. %, or from 2 wt. % to 30 wt. %, The amount of solvent included in the dielectric coating compositions may be adjusted to provide a specific viscosity, which may depend on the deposition or printing method to be used. For example, the dielectric coating compositions may have viscosities measured at 25° C. of from about 1 centipoise to about 20,000 centipoise, such as from about 1 centipoise to about 10,000 centipoise or from about 1 centipoise to about 1,000 centipoise or from about 1 centipoise to about 200 centipoise or from about 2 centipoise to about 100 centipoise.

According to certain preferred aspects, the dielectric coating compositions of the present invention may have viscosities amenable to application by ink jet printing, thereby allowing very precise placement of the composition. Viscosities suitable for inkjet printing techniques are generally less than 40 centipoise, such as from about 2 centipoise to about 40 centipoise, or from about 1 centipoise to about 20 centipoise, or from about 1 centipoise to about 10 centipoise, all measured at 25° C.

According to certain aspects of the present invention, the dielectric coating composition may have a viscosity measured at 25° C. greater than 100 centipoise and may be amenable for printing using gravure and/or flexographic printing techniques. For example, the dielectric coating composition may have a viscosity of at least 50 centipoise but less than 20,000 centipoise, such as from 50 centipoise to 500 centipoise, or from 100 centipoise to 400 centipoise, or even from 100 centipoise to 300 centipoise. This may be achieved by careful selection of the aqueous binder used in the composition, and the overall solids content of the composition. Moreover, the viscosity can be adjusted as required for any printing or deposition technique known in the art by either thinning, such as with additional solvent, or by the addition of rheological additives such as thixotropic agents, thickeners, and flow modifiers.

Additives may also be included to adapt the wetting properties of the dielectric coating compositions. Additives such as wetting agents, dispersants, adhesion promoters, surfactants, biocides, and leveling agents may be included. Such additives may be included at up to 10 wt. % of one or more additives, such as up to 8 wt. %, or up to 6 wt. %, or up to 4 wt. %, or up to 2 wt. %, or up to 1 wt. %, or up to 0.1 wt. %, or up to 0.05 wt. %. The dielectric coating compositions may include additives at from 0.01 wt. % to 5 wt. %, such as 0.01 wt. % to 4 wt. %, or 0.01 wt. % to 3 wt. %, or 0.01 wt. % to 2 wt. %, or 0.01 wt. % to 1 wt. % of the total solids weight of the dielectric coating composition.

According to certain aspects, the dielectric coating composition of the present invention are substantially or totally free of additives such as wetting agents, dispersants, adhesion promoters, surfactants, biocides, and leveling agents.

According to certain aspects, the dielectric coating compositions disclosed herein may be clear. According to certain aspects, the dielectric coating compositions may further include one or more pigments or dyes. These may be added to the system or may be included as a separate component. Pigments and/or dyes may be included at from about 0.1 wt. % to about 15 wt. % of the total solids weight of the dielectric coating composition.

When the intended substrate is a flexible or stretchable substrate, such as a textile or fabric, the dielectric coating compositions of the present invention may include a plasticizer. According to certain aspects, suitable plasticizers include glycols and glycol ethers, such as ethylene glycol, diethylene glycol, PEG 400, and PEG 800. Further exemplary plasticizers include triethyl citrate and glycerol. Plasticizers may be added at up to about 40 wt. % based on the weight of the water-soluble binder included in the dielectric coating composition, such as from 0.1 wt. % to 40 wt. %.

According to certain aspects of the present invention, the dielectric coating composition may be formulated to have a surface tension of from about 20 dyne-cm to about 75 dyne-cm, such as from about 20 dyne-cm to about 50 dyne-cm or even from about 25 dyne-cm to about 45 dyne-cm.

According to certain aspects of the present invention, the compositions may be used to form dielectric coatings and surfaces on a wide range of substrates. Exemplary substrates include organic, inorganic, or synthetic substrates known in the art, such as any of metal, glass, paper, plastic, leather, wood, textiles, fabrics, or ceramic. Exemplary substrates include flexible substrates such as polymer films and fabrics, including organic or synthetic woven and non-woven fibers. Exemplary fibers of such textile substrates include at least polyester, polyamides, spandex, polyester-spandex, nylon, nylon-spandex, Evolon®, elastane, and other synthetic materials, in addition to organic materials (e.g., cotton, cellulose, silk, wood, wool fibers, leather, suede). Blends of any of these materials are also possible.

Additionally, the dielectric coating compositions disclosed herein demonstrate excellent adhesion to a wide range of base surfaces, including conductive metal traces and polymer films, in addition to textiles such as fabrics. The dielectric coating compositions disclosed herein are also readily receptive to coatings or conductive metal inks, such as by coating or printing on the dielectric coating composition. Thus, layered structures are easily formed. For example, layered structures including conductive (C) and non-conductive (NC) layers, e.g., C/NC/C, where the non-conductive layer comprises any of the dielectric coating compositions disclosed herein are possible and an aspect of the presently disclosed invention.

The dielectric coating composition may be provided premixed as a single component system that is ready for application. Alternatively, the dielectric coating composition may be provided as a concentrated formulation with separate solvent(s) to dilute the composition, such as to provide a composition amendable for a specific printing method.

For example, the dielectric coating compositions disclosed herein may be adapted for printing via inkjet printing techniques by adjusting the viscosity measured at 25° C. to at least 1 centipoise up to 40 centipoise. Nozzles can be used to deposit the composition, and the nozzle diameter can be, for example, less than 400 micrometers, or even less than 200 micrometers. The nozzle may deposit the composition in droplets, wherein a drop size may be less than 300 micrometers. The nozzle may deposit the ink in droplets, wherein a drop volume is less than 200 picoliter (pL), or less than 100 pL. The drops may be deposited at a density greater than 30 drops per inch, such as greater than 60 drops per inch, or greater than 90 drops per inch, or greater than 200 drops per inch, or greater than 500 drops per inch, or greater than 1,000 drops per inch, or greater than 1,500 drops per inch, or greater than 2,500 drops per inch.

While specific numbers are listed herein for the size and density of the droplets, volume of the droplets, and the nozzle size, these values may vary depending on the printing method chosen, the printer chosen (e.g., nozzle configuration), the viscosity of the conductive ink, and the coverage desired.

The dielectric coating compositions may be stable at ambient conditions for at least 6 months, depending upon the dilution and storage temperature.

While the dielectric coating compositions have been discussed in terms of providing an insulating layer, such as over, under, or between one or more conductive layers, the presently disclosed coatings and compositions may find uses in a broad range of application. For example, the dielectric coating compositions of the present invention may be useful as transparent abrasion resistant coatings, such as on polymer films or fabrics. The dielectric coating compositions of the present invention may also be useful in providing an electromagnetic radiation absorption layer for reducing electromagnetic interference (EMI) in electronic devices. Certain exemplary printing methods and substrates are disclosed in U.S. Patent Publication No. 2019/0249026.

According to certain aspects, the dielectric coating compositions disclosed herein may be printed over a conductive metal trace to form a protective scratch-resistant dielectric coating on all, or at least a portion of, the conductive metal trace. According to certain aspects, the conductive metal trace may be printed on the cured dielectric film formed by the presently disclosed dielectric coating composition. Furthermore, as indicated above, layered structures comprising any arrangement of conductive and dielectric (i.e., non-conductive) layers according to the present invention are envisioned and possible according to aspects of the present invention.

The conductive metal trace may be a conductive trace formed by a particle-free conductive ink according to any of U.S. Patent Publication Nos. 2019/0249026, 2013/0236656, 2011/0111138, or U.S. Pat. No. 9,487,669. The particle-free conductive inks disclosed in these publications comprise a metal complex dissolved in a solvent, wherein the metal complex can be mononuclear, dinuclear, trinuclear, and higher. For example, the metal complex may be a neutral metal complex comprising at least one metal, at least one first ligand, and at least one second ligand. Alternatively, the metal complex may comprise a first metal complex having at least one first metal, and a second metal complex having at least one second metal. The conductive ink is substantially or completely free of particles, including nanoparticles and microparticles.

According to certain aspects of the conductive ink, the metal complex comprises at least one metal, at least one first ligand, and at least one second ligand, wherein the metal may be silver, gold, copper, nickel, cobalt, zinc, aluminum, or platinum. Exemplary first ligands include amines and sulfur containing compounds, and exemplary second ligands include carboxylic acids, dicarboxylic acids, and tricarboxylic acids. Exemplary solvents include one or more polar protic solvents, such as at least two polar protic solvents selected from the group comprising at least water, alcohols, amines, amino alcohols, polyols, and combinations thereof. According to certain other aspects, the metal complex may comprise at least one first metal complex having at least one first metal, at least one second metal complex having at least one second metal, at least one third metal complex having at least one third metal, and so forth, wherein each metal complex may comprise stoichiometric amounts of a metal and first and second ligands. For example, the metal complex may comprise two neutral metal complexes formed as detailed above (i.e., having stoichiometric amounts of a metal and first and second ligands).

According to certain aspects of the conductive ink, the metal complex may be configured to provide a metal alloy (e.g., after curing). The metal complex may comprise at least one first metal complex, wherein the first metal complex comprises a first metal and at least one first ligand and at least one second ligand, different from the first ligand; and at least one second metal complex, which is different from the first metal complex, and comprises a second metal and at least one first ligand and at least one second ligand, different from the first ligand, for the second metal; and at least one solvent. The (i) the selection of the amount of the first metal complex and the amount of the second metal complex, (ii) the selection of the first ligands and the selection of the second ligands for the first and second metals, and (iii) the selection of the solvent may be adapted to provide a homogeneous composition. According to yet other aspects, the metal complex may comprise at least one first metal complex having at least one first metal in an oxidation state of (I) or (II), and at least two ligands, wherein at least one first ligand is an amine and at least one second ligand is a carboxylate anion; at least one second metal complex, which is different from the first metal complex, wherein the second metal complex is a neutral complex comprising at least one second metal in an oxidation state of (I) or (II), and at least two ligands, wherein at least one first ligand is a sulfur compound and at least one second ligand is the carboxylate anion of the first metal complex. Examples of binary combinations of metals to form binary alloys include at least Ag—Au, Au—Cu, Pt—Cu, Ni—Al, Cu—Ni, Ag—Cu, Cu—Al, and Pt—Ni.

Thus, the presently disclosed invention provides articles having both a dielectric coating as disclosed herein, and a conductive metal trace deposited from a particle-free conductive ink. These two films or layers may be arranged to form a wide variety of patterns for a large range of uses. As indicated above, the dielectric coating may be coated or printed over a conductive metal trace to protect or insulate all, or a portion of, the metal trace. Alternatively, the dielectric coating may be deposited or printed on a substrate to provide a surface on which the conductive metal trace may be printed. Moreover, the conductive metal trace and the dielectric coating may be alternately deposited or printed to form a unique electronic element or device. For example, the dielectric coating may be used as an insulating layer between various layers of the conductive ink to form a sensor, an electrode, a circuit, an interconnect, a light, an antenna, a resistive heating element, a switch, a battery, or any combination thereof.

Accordingly, the presently disclosed invention is also directed to a substrate comprising a dielectric coating deposited from any of the dielectric coating compositions disclosed herein, and a conductive metal trace deposited from a particle-free conductive ink, such as any of the conductive inks detailed hereinabove. The dielectric coating may act as an insulating layer on the substrate. The substrate may be a metal, glass, or plastic substrate. According to certain aspects, the substrate may be a flexible, such as a textile substrate (e.g., plastic film, fabric, etc.). Exemplary textiles include knit, woven, or nonwoven fabrics, such as fabrics comprising fibers of polyester, polyamides, spandex, nylon, Evolon®, elastane, cotton, cellulose, silk, wood, wool, or blends thereof. Certain additives may be included in the dielectric coating composition to improve performance on such flexible substrates.

According to certain aspects of the present invention, the substrate may be heated before and/or during deposition of the conductive ink and/or dielectric coating compositions.

For example, the substrate may be heated to temperatures of 30° C. to 90° C., such as on a heated platen. For example, the inkjet printer may include a heated platen, such as the FujiFilm Dimatix DMP 2850 and DMP 2931, wherein the platen may be heated to temperatures of 30° C. to 90° C., such as 30° C. to 60° C., or 40° C. to 90° C. during printing.

According to certain aspects, the dielectric coating may include only a single inorganic nanoparticle. According to certain other aspects of the present invention, the dielectric coating composition may include more than one inorganic nanoparticle.

The present invention is also directed to e-textiles. These e-textiles include any textile having printed thereon at least one conductive trace or pattern, and at least one insulating layer deposited from any of the dielectric coating compositions disclosed herein. The traces may terminate in contact pads or connectors for connection to a current, such as a power supply or battery. Various hardware elements may be connected to portions of the trace or pattern to form electric devices. As such, the conductive patterns on the e-textiles may be formed as a trace or pattern that may provide a sensor (e.g., optical, thermal, humidity, gas, pressure, acceleration, strain, force, and proximity), a conductor, an electrode, a circuit, an interconnect, a light, an antenna, a resistive heating element, a switch, a transparent conductive element, a battery, or any combination thereof.

The e-textiles may be incorporated into wearable electronic devices or may themselves be wearable electronic devices. The e-textiles may find use in many different industries for a wide range of uses, such as in the medical industry for health monitoring or as anti-microbial dressings, and in industrial settings as smart clothing or devices for gas sensing or filtration. The e-textiles may find use in smart garments, such as for fitness monitoring, hygiene improvement, or as flexible energy storage devices (e.g., batteries, supercapacitors). The e-textiles may find use as resistive heaters, such as in a wearable garment or in an automobile (e.g., seat heater, electric vehicle heater).

Exemplary e-textiles may include, for example, a directional compass, one or more gyroscopes, one or more accelerometers, pressure gauges, strain gauges, temperature gauges, and fiber optics. The sensors employed in e-textiles may be used to monitor parameters of a user wearing the e-textile, such parameters may include heart rate, respiration rate, skin temperature, and body position and movement. Moreover, e-textiles may be used to measure a user's full-body biomechanics such as joint angles, angular velocity, angular acceleration, and range of motion.

All documents cited herein are incorporated herein by reference, but only to the extent that the incorporated material does not conflict with existing definitions, statements, or other documents set forth herein. To the extent that any meaning or definition of a term in this document conflicts with any meaning or definition of the same term in a document incorporated by reference, the meaning or definition assigned to that term in this document shall govern. The citation of any document is not to be construed as an admission that it is prior art with respect to the systems and methods described herein.

Aspects of the Invention

The following aspects are disclosed in this application:

Aspect 1. A dielectric coating composition comprising an aqueous binder, an inorganic nanoparticle; and an aqueous solvent.

Aspect 2: The dielectric coating composition according to any of the previous aspects, comprising 2-15 wt. % of the aqueous binder and 1-15 wt. % of the inorganic nanoparticle.

Aspect 3: The dielectric coating composition according to any of the previous aspects, wherein the aqueous binder is selected from the group consisting of a polyvinyl alcohol, a cellulose, poly(4-vinylphenol), and a hydrogel.

Aspect 4: The dielectric coating composition according to any of the previous aspects, wherein the aqueous binder comprises polyvinyl alcohol having a weight average molecular weight of 8,000 to 13,000.

Aspect 5: The dielectric coating composition according to any of the previous aspects, wherein the aqueous binder comprises polyvinyl alcohol having a weight average molecular weight of 30,000 to 55,000.

Aspect 6: The dielectric coating composition according to any of the previous aspects, wherein the inorganic nanoparticle comprises a $SiO_2$, $Al_2O_3$, $TiO_2$, $ZrO_2$, nanoclay, or a combination thereof.

Aspect 7: The dielectric coating composition according to any of the previous aspects, wherein the inorganic nanoparticle has a particle size of 250 nm or less, or 200 nm or less, or 150 nm or less, or 100 nm or less, or 50 nm or less.

Aspect 8: The dielectric coating composition according to any of the previous aspects, wherein the inorganic nanoparticle is selected from the group consisting of $SiO_2$ having a particle size of less than 50 nm, alumina having a particle size of less than 50 nm, iron oxide having a particle size of less than 250 nm, and mixtures thereof.

Aspect 9: The dielectric coating composition according to any of the previous aspects, wherein the composition has a viscosity of 50 to 300 centipoise suitable for gravure or flexographic printing.

Aspect 10: The dielectric coating composition according to any of the previous aspects, wherein the composition has a viscosity of 2 to 40 centipoise suitable for ink jet printing.

Aspect 11: The dielectric coating composition according to any of the previous aspects, wherein the solvent comprises one or more polar protic solvents.

Aspect 12: The dielectric coating composition according to any of the previous aspects, wherein the solvent comprises one or more polar protic solvents selected from water and an alcohol.

Aspect 13: The dielectric coating composition according to any of the previous aspects, wherein the coating composition of clear.

Aspect 14. A substrate comprising a cured coating formed by the dielectric coating composition according to any one of aspects 1 to 13, wherein the cured coating comprises 10 wt. % to 70 wt. % of the inorganic nanoparticle with respect to the total solids content of the cured coating.

Aspect 15. The substrate according to aspect 14, wherein the cured coating comprises 10 wt. % to 40 wt. % of the inorganic nanoparticle with respect to the total solids content of the cured coating.

Aspect 16. The substrate according to aspects 14 or 15, wherein the cured coating is clear.

Aspect 17. The substrate according to any one of aspects 14 to 16, wherein the substrate is selected from the group consisting of metal, plastic, glass, ceramic, paper, textile, fabric, and any combination thereof.

Aspect 18: The substrate according to any one of aspects 14 to 17, wherein the substrate and the cured coating are flexible.

Aspect 19. A method for printing an insulating layer on a substrate comprising providing a dielectric coating composition according to any one of aspects 1 to 13 and printing the composition onto a substrate.

Aspect 20. The method according to aspect 19, wherein the printing comprises inkjet printing and the dielectric coating composition has a viscosity of 2 to 40 centipoise.

Aspect 21. The method according to aspect 19 or 20, wherein the inorganic nanoparticle is selected from the group consisting of $SiO_2$ having a particle size of less than 50 nm and alumina having a particle size of less than 50 nm.

Aspect 22. The method according to any one of aspects 19 to 21, further comprising curing the composition using thermal energy.

Aspect 23. The method according to any one of aspects 19 to 22, wherein curing comprises heating the substrate to a temperature of 120° C. to 150° C. for 0.1 minute to 30 minutes.

Aspect 24. The method according to any one of aspects 19 to 23, wherein the aqueous binder is selected from the group consisting of polyvinyl alcohol having a weight average molecular weight of 8,000 to 13,000, and polyvinyl alcohol having a weight average molecular weight of 30,000 to 55,000.

Aspect 25. The method according to any one of aspects 19 to 24, wherein the substrate comprises metal, plastic, glass, ceramic, paper, textile, fabric, or any combination thereof.

Aspect 26. An e-textile comprising at least one conductive trace formed by a particle-free conductive ink; and at least one insulating layer deposited by the dielectric coating composition according to any one of aspects 1 to 13, wherein the at least one insulating layer may be positioned over, under, or both over and under the at least one conductive trace.

Aspect 27. The e-textile according to aspects 26, wherein the e-textile functions as a sensor, an electrode, a circuit, an electromagnetic radiation absorber, an interconnect, a light, an antenna, a resistive heating element, a switch, a battery, or any combination thereof.

Examples

Dielectric coating compositions according to the presently disclosed invention were formulated, as shown in Table 1. Solids content, viscosity, surface tension, and water resistance of the cured coatings are shown in Table 2. Each of these example coatings were cured at either 140° C. or 150° C. for 5, 10, or 20 minutes. Additionally, all of the example coating compositions were found to adhere well to polyester films.

As shown in the examples, the presently disclosed invention provides compositions capable of forming clear dielectric films on a substrate. The compositions may be low viscosity and may therefore be amenable to deposition methods such as ink jet printing.

Finally, resistance measurements with standard testing equipment indicate the cured coatings likely have resistance readings in the megaohm per square range, i.e., are dielectric.

TABLE 1

| Example | Aqueous Binder | | Inorganic Nanoparticle | | Solvent (wt. %) | | Additive |
|---|---|---|---|---|---|---|---|
| | type | (wt. %) | type | (wt. %) | Water | Alcohol | (wt. %) |
| 1 | PVA1 | 7.0 | silica1 | 3 | 90 | 0 | 0 |
| 2 | PVA1 | 8.0 | silica1 | 2 | 90 | 0 | 0 |
| 3 | PVA1 | 8.0 | silica1 | 1 | 91 | 0 | 0 |
| 4 | PVA1 | 13.5 | silica1 | 1.5 | 85 | 0 | 0 |
| 5 | PVA1 | 12.0 | silica1 | 3 | 85 | 0 | 0 |

TABLE 1-continued

| Example | Aqueous Binder type | (wt. %) | Inorganic Nanoparticle type | (wt. %) | Solvent (wt. %) Water | Alcohol | Additive (wt. %) |
|---|---|---|---|---|---|---|---|
| 6 | PVA1 | 6.0 | silica1 | 4 | 90 | 0 | 0 |
| 7 | PVA1 | 3.5 | silica1 | 1.5 | 95 | 0 | 0 |
| 8 | PVA1 | 3.45 | silica1 | 1.5 | 95 | 0 | 0.05 |
| 9 | PVA1 | 3.5 | silica1 | 2.4 | 94 | 0 | 0 |
| 10 | PVA1 | 3.5 | silica1 | 2.4 | 84 | 10 | 0 |
| 11 | PVA1 | 3.45 | silica1 | 1.5 | 66.6 | 28.5 | 0.05 |
| 12 | PVA1 | 3.54 | silica1 | 2.4 | 65.8 | 28.2 | 0.06 |
| 13 | PVA1 | 2.5 | silica1 | 2.45 | 66.5 | 28.5 | 0 |
| 14 | PVA1 | 2.65 | silica1 | 1.8 | 66.9 | 28.7 | 0.05 |
| 15 | PVA2 | 7.2 | silica1 | 4.8 | 61.6 | 26.4 | 0 |
| 16 | PVA2 | 4.2 | silica1 | 2.8 | 65.1 | 27.9 | 0 |
| 17 | HEC | 4.2 | silica1 | 2.8 | 65.1 | 27.9 | 0 |
| 18 | HEC | 4.2 | nanoclay | 2.8 | 65.1 | 27.9 | 0 |
| 19 | PVP | 4.2 | silica1 | 2.8 | 65.1 | 27.9 | 0 |
| 20 | HEC | 4.2 | alumina1 | 2.8 | 65.1 | 27.9 | 0 |
| 21 | PVA2 | 4.2 | alumina2 | 2.8 | 65.1 | 27.9 | 0 |
| 22 | PVA2 | 3.6 | alumina2 | 2.4 | 65.8 | 28.2 | 0 |
| 23 | PVA2 | 3.0 | alumina2 | 2.0 | 66.5 | 28.5 | 0 |
| 24 | PVP | 3.6 | alumina1 | 2.4 | 56.4 | 37.6 BC | 0 |
| 25 | PVP | 4.1 | silica1 | 2.7 | 53.2 | 40.1 BC | 0 |
| 26 | PVA2 | 4.2 | silica1/iron oxide | 1.75/1.05 | 64.9 | 28.1 | 0 |
| 27 | PVA2 | 4.8 | silica1/iron oxide | 1.2/2.0 | 64.4 | 27.6 | 0 |
| 28 | PVA2 | 6.0 | Iron oxide | 2.0 | 64.4 | 27.6 | 0 |
| 29 | PVA2 | 5.2 | Iron oxide | 2.8 | 64.4 | 27.6 | 0 |
| 30 | PVA2 | 5.4 | Iron oxide | 3.6 | 63.7 | 27.3 | 0 |
| 31 | PVA2 | 5.0 | silica1/iron oxide | 0.9/2.7 | 63.7 | 27.3 | 0 |

Binders: PVA1-polyvinyl alcohol 31,000-50,000 Mw, with 87-89% hydrolysis; PVA2-polyvinyl alcohol, 9,000-10,000 Mw, with 80% hydrolysis; HEC-hydroxyethyl cellulose, 90,000 Mw; PVP-poly(4-vinylphenol), 11,000 Mw. Inorganic nanoparticle: silica1-colloidal silica, particle size 10-20 nm, 20-21 wt. % $SiO_2$; alumina1-dispersion of alumina, particle size 40 nm, 10 wt. %; alumina2 dispersion of alumina, particle size 20 nm, 10 wt.%; iron oxide-dispersion of Fe2O3 prepared by co-precipitation method, particle size 180 nm (B.I. Macias-Martinez, et al., Journal of Applied Research and Technology, 2016, Vol. 14(4):239-244). Additive: surfactant. Alcohol: isopropanol or Butyl Cellosolve™ (Dow). Surfactant-Capstone™ FS-65 (nonionic fluorinated surfactant from Chemours Company).

TABLE 2

| | Coating Composition | | | Cured Coating | | |
|---|---|---|---|---|---|---|
| Example | Solids (wt. %) | Viscosity (cP at 25° C.) | Surface tension (dyne-cm) | Inorganic nanoparticles (wt. %) | Water resistance (double rubs) | Film Appearance |
| 1 | 10 | 17 | — | 30 | — | clear |
| 2 | 10 | — | — | 20 | — | clear |
| 3 | 9 | — | — | 11 | — | clear |
| 4 | 15 | — | — | 10 | — | clear |
| 5 | 15 | — | — | 20 | — | clear |
| 6 | 10 | 5 | — | 40 | — | clear |
| 7 | 5.0 | 5 | 44 | 30 | >50 | clear |
| 8 | 5.0 | 5 | 38 | 30 | — | clear |
| 9 | 5.9 | 5 | — | 41 | >50 | clear |
| 10 | 5.9 | — | 35 | 41 | — | clear |
| 11 | 5.0 | 12 | 29 | 30 | >25 | clear |
| 12 | 6.0 | 13 | 29 | 40 | >25 | clear |
| 13 | 5.0 | 9 | — | 49 | >25 | clear |
| 14 | 4.5 | 9 | 28 | 40 | — | clear |
| 15 | 12 | 21 | 27 | 40 | — | clear |
| 16 | 7.0 | 8 | 27 | 40 | — | clear |
| 17 | 7.0 | 245 | — | 40 | >50 | frosted |
| 18 | 7.0 | 270 | — | 40 | >50 | hazy |
| 19 | 7.0 | — | — | 40 | >50 | hazy |
| 20 | 7.0 | 560 | 33 | 40 | >50 | clear |
| 21 | 7.0 | 12.8 | 27 | 40 | >50 | clear |
| 22 | 6.0 | 10.2 | 27 | 40 | >50 | clear |
| 23 | 5.0 | 8.5 | 27 | 40 | >50 | clear |
| 24 | 6.0 | 6.5 | 27 | 40 | >50 | clear |
| 25 | 6.75 | 6.8 | 27 | 40 | >50 | clear |
| 26 | 7.0 | — | 27 | 40 | >50 | clear brown |
| 27 | 8.0 | — | 27 | 40 | >50 | clear brown |
| 28 | 8.0 | — | — | 25 | >50 | clear brown |
| 29 | 8.0 | — | — | 35 | >50 | clear brown |
| 30 | 9.0 | — | — | 40 | 25 | clear brown |
| 31 | 9.0 | — | — | 40 | 20 | clear brown |

"—" not tested.

What is claimed is:

1. A dielectric coating composition comprising:
   2-15 wt. % of an aqueous binder selected from the group consisting of a polyvinyl alcohol, a cellulose, and a hydrogel;
   1-15 wt. % of an inorganic nanoparticle, wherein the inorganic nanoparticle is selected from the group consisting of $SiO_2$, $Al_2O_3$, $TiO_2$, $ZrO_2$, nanoclay, and a combination thereof; and
   an aqueous solvent,
   wherein the aqueous binder and inorganic nanoparticle are added as 50:50 wt. % to 90:10 wt. % of aqueous binder:inorganic nanoparticle.

2. The dielectric coating composition of claim 1, wherein the aqueous binder comprises polyvinyl alcohol having a weight average molecular weight of 8,000 to 13,000.

3. The dielectric coating composition of claim 1, wherein the aqueous binder comprises polyvinyl alcohol having a weight average molecular weight of 30,000 to 55,000.

4. The dielectric coating composition of claim 1, wherein the inorganic nanoparticle is selected from the group consisting of $SiO_2$ having a particle size of less than 50 nm, alumina having a particle size of less than 50 nm, iron oxide having a particle size of less than 250 nm, and mixtures thereof.

5. The dielectric coating composition of claim 1, wherein the composition has a viscosity of 50 to 300 centipoise suitable for gravure or flexographic printing.

6. The dielectric coating composition of claim 1, wherein the composition has a viscosity of 2 to 40 centipoise suitable for ink jet printing.

7. The dielectric coating composition of claim 1, wherein the solvent comprises one or more polar protic solvents.

8. The dielectric coating composition of claim 7, wherein the one or more polar protic solvents are selected from water and an alcohol.

9. A dielectric coating composition formulated for inkjet printing, the composition comprising:
   2-15 wt. % of an aqueous binder selected from the group consisting of a polyvinyl alcohol, a cellulose, and a hydrogel;
   1-15 wt. % of an inorganic nanoparticle selected from the group consisting of $SiO_2$ having a particle size of less than 50 nm and $Al_2O_3$ having a particle size of less than 50 nm; and one or more polar protic solvents are selected from the group consisting of water and an alcohol, wherein the composition has a viscosity of 2 to 40 centipoise, and wherein the aqueous binder and inorganic nanoparticle are added as 50:50 wt. % to 90:10 wt. % of aqueous binder:inorganic nanoparticle.

10. A substrate comprising a cured coating formed by the dielectric coating composition according to claim 9, wherein the cured coating comprises 10 wt. % to 70 wt. % of the inorganic nanoparticle with respect to a total solids content of the cured coating; and the substrate is selected from the group consisting of metal, plastic, glass, ceramic, paper, textile, fabric, and any combination thereof.

11. The substrate of claim 10, wherein the substrate and the cured coating are flexible.

12. A method of printing an insulating layer comprising:
providing a dielectric coating composition for forming the insulating layer, the composition comprising:
2-15 wt. % of an aqueous binder selected from the group consisting of a polyvinyl alcohol, a cellulose, and a hydrogel,
1-15 wt. % of an inorganic nanoparticle, wherein the inorganic nanoparticle is selected from the group consisting of $SiO_2$, $Al_2O_3$, $TiO_2$, $ZrO_2$, nanoclay, and a combination thereof, and
an aqueous solvent,
wherein the aqueous binder and inorganic nanoparticle are added as 50:50 wt. % to 90:10 wt. % of aqueous binder:inorganic nanoparticle; and
printing the composition onto a substrate.

13. The method of claim 12, wherein the printing comprises inkjet printing, the inorganic nanoparticle is selected from the group consisting of $SiO_2$ having a particle size of less than 50 nm and alumina having a particle size of less than 50 nm, and the dielectric coating composition has a viscosity of 2 to 40 centipoise.

14. The method of claim 12, further comprising:
curing the composition using thermal energy.

15. The method of claim 14, wherein curing comprises heating the substrate to a temperature of 120° C. to 150° C. for 0.1 minute to 30 minutes.

16. The dielectric coating composition of claim 1, wherein the aqueous binder is selected from the group consisting of polyvinyl alcohol having a weight average molecular weight of 8,000 to 13,000, and polyvinyl alcohol having a weight average molecular weight of 30,000 to 55,000.

17. The method of claim 12, wherein the substrate comprises metal, plastic, glass, ceramic, paper, textile, fabric, or any combination thereof.

18. An e-textile comprising:
at least one conductive trace formed by a particle-free conductive ink; and
at least one insulating layer deposited by the dielectric coating composition according to claim 1, wherein the at least one insulating layer may be positioned over, under, or both over and under the at least one conductive trace.

19. The e-textile of claim 18, wherein the e-textile functions as a sensor, an electrode, a circuit, an interconnect, an electromagnetic radiation absorber, a light, an antenna, a resistive heating element, a switch, a battery, or any combination thereof.

* * * * *